(12) United States Patent
Blümel et al.

(10) Patent No.: US 7,918,574 B2
(45) Date of Patent: Apr. 5, 2011

(54) ILLUMINATION DEVICE

(75) Inventors: Simon Blümel, Schierling (DE); Hubert Ott, Bad Abbach (DE); Ludwig Ploetz, Arnschwang (DE); Mario Wanninger, Regensburg (DE); Guenter Kirchberger, Sinzing (DE); Peter Wolff, Donaustauf (DE); Markus Zeiler, Nittendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/096,848

(22) PCT Filed: Dec. 15, 2006

(86) PCT No.: PCT/DE2006/002266
§ 371 (c)(1),
(2), (4) Date: Nov. 21, 2008

(87) PCT Pub. No.: WO2007/076818
PCT Pub. Date: Jul. 12, 2007

(65) Prior Publication Data
US 2009/0213575 A1 Aug. 27, 2009

(30) Foreign Application Priority Data

Dec. 16, 2005 (DE) .......... 10 2005 060 382
Jul. 21, 2006 (DE) .......... 10 2006 033 893

(51) Int. Cl.
*G09F 13/04* (2006.01)
(52) U.S. Cl. .......... 362/97.3; 362/231; 362/249.02

(58) Field of Classification Search .......... 362/977.3, 362/249.02, 231, 555, 561, 97.1, 97.2, 97.4, 362/800; 349/61–71
See application file for complete search history.

(56) References Cited

U.S. PATENT DOCUMENTS

| 4,907,044 | A | 3/1990 | Schellhorn et al. |
| 6,066,861 | A | 5/2000 | Höhn et al. |
| 6,111,272 | A | 8/2000 | Heinen |
| 6,576,930 | B2 | 6/2003 | Reeh et al. |
| 6,592,780 | B2 | 7/2003 | Höhn et al. |
| 6,598,998 | B2 | 7/2003 | West et al. |
| 6,607,286 | B2 | 8/2003 | West et al. |
| 6,679,621 | B2 | 1/2004 | West et al. |
| 6,957,901 | B2 | 10/2005 | Schach et al. |
| 7,078,732 | B1 | 7/2006 | Reeh et al. |
| 7,281,816 | B2 * | 10/2007 | Suzuki .......... 362/231 |
| 7,320,531 | B2 * | 1/2008 | West et al. .......... 362/231 |

(Continued)

FOREIGN PATENT DOCUMENTS

DE  8713875  3/1988

(Continued)

OTHER PUBLICATIONS

Examination report issued in corresponding European Application No. 06 705 820.6 on Dec. 11, 2008.

(Continued)

*Primary Examiner* — Laura Tso
(74) *Attorney, Agent, or Firm* — Fish & Richardson P.C.

(57) ABSTRACT

A lighting apparatus comprising a plurality of light modules is specified, wherein each light module includes a plurality of groups of light sources mounted on a circuit board of said light module, and said light modules are arranged in rows on a carrier of said lighting apparatus. A display device comprising such a lighting apparatus is also specified.

15 Claims, 5 Drawing Sheets

U.S. PATENT DOCUMENTS

| | | | |
|---|---|---|---|
| 2003/0063062 A1 | 4/2003 | Tsumura et al. | |
| 2003/0161137 A1 | 8/2003 | Schach et al. | |
| 2004/0008524 A1 | 1/2004 | Lee et al. | |
| 2004/0218388 A1 | 11/2004 | Suzuki | |
| 2004/0262623 A1 | 12/2004 | You | |
| 2005/0001537 A1 | 1/2005 | West et al. | |
| 2006/0007553 A1 | 1/2006 | Bogner et al. | |
| 2006/0138437 A1* | 6/2006 | Huang et al. | 257/98 |
| 2006/0180820 A1 | 8/2006 | Illek et al. | |
| 2006/0209538 A1* | 9/2006 | Chang et al. | 362/231 |
| 2006/0232969 A1 | 10/2006 | Bogner et al. | |
| 2008/0024696 A1 | 1/2008 | Arai et al. | |

FOREIGN PATENT DOCUMENTS

| | | |
|---|---|---|
| DE | 20007730 | 9/2000 |
| EP | 0905797 | 3/1999 |
| EP | 0921568 | 6/1999 |
| EP | 1380876 | 1/2004 |
| EP | 1521235 | 4/2005 |
| EP | 1594172 | 11/2005 |
| EP | 1 801 637 | 6/2007 |
| GB | 2361581 | 10/2001 |
| JP | 8030213 | 2/1996 |
| JP | 11-003051 | 1/1999 |
| WO | WO 97/50132 | 12/1997 |
| WO | WO 98/12757 | 3/1998 |
| WO | WO 01/83264 | 11/2001 |
| WO | WO 02/13281 | 2/2002 |
| WO | WO 02/079862 | 10/2002 |
| WO | WO 2004/031844 | 4/2004 |
| WO | WO 2004/032235 | 4/2004 |
| WO | WO 2006/040937 | 4/2006 |

OTHER PUBLICATIONS

Cossu, Alessandro, "Examination Report", European Application No. 06 828,696.2, Apr. 16, 2009 (6 pages).

Ploetz, L. et al., "LED Display Backlighting—Large Screen and TV Application Using Golden DRAGON® ARGUS®" *OSRAM*, pp. 1-8, 2005.

International Search Report for PCT/DE2006/002266 dated May 8, 2007.

Cossu, Alessandro, "Examination Report", European Patent Office, Application No. 06 828 696.2, Aug. 11, 2009 (5 pages).

* cited by examiner

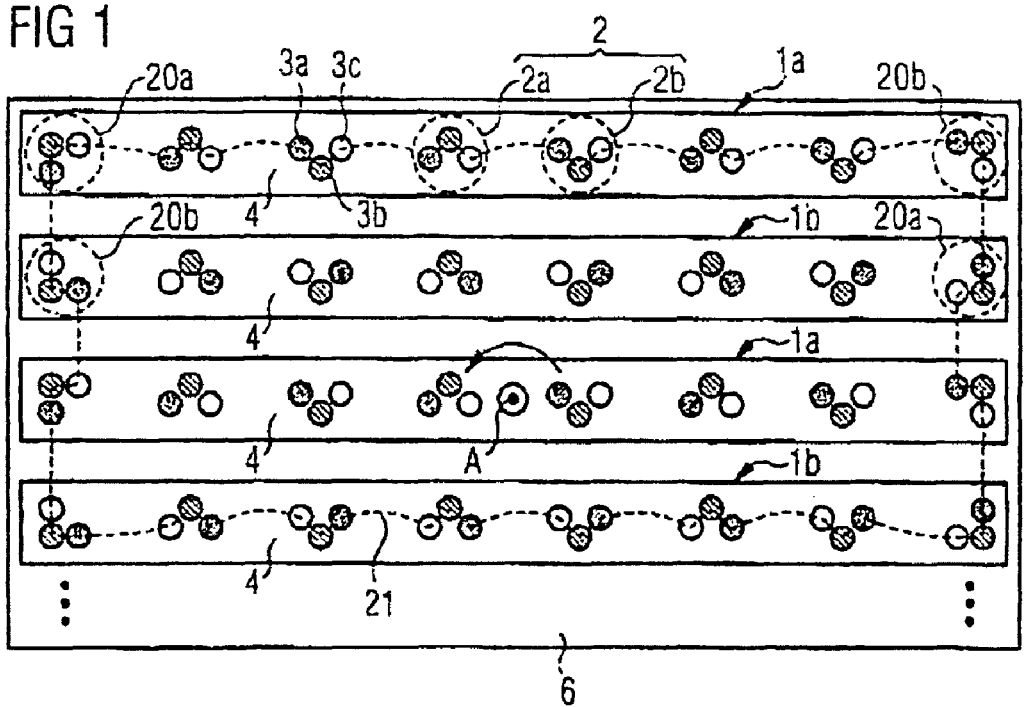
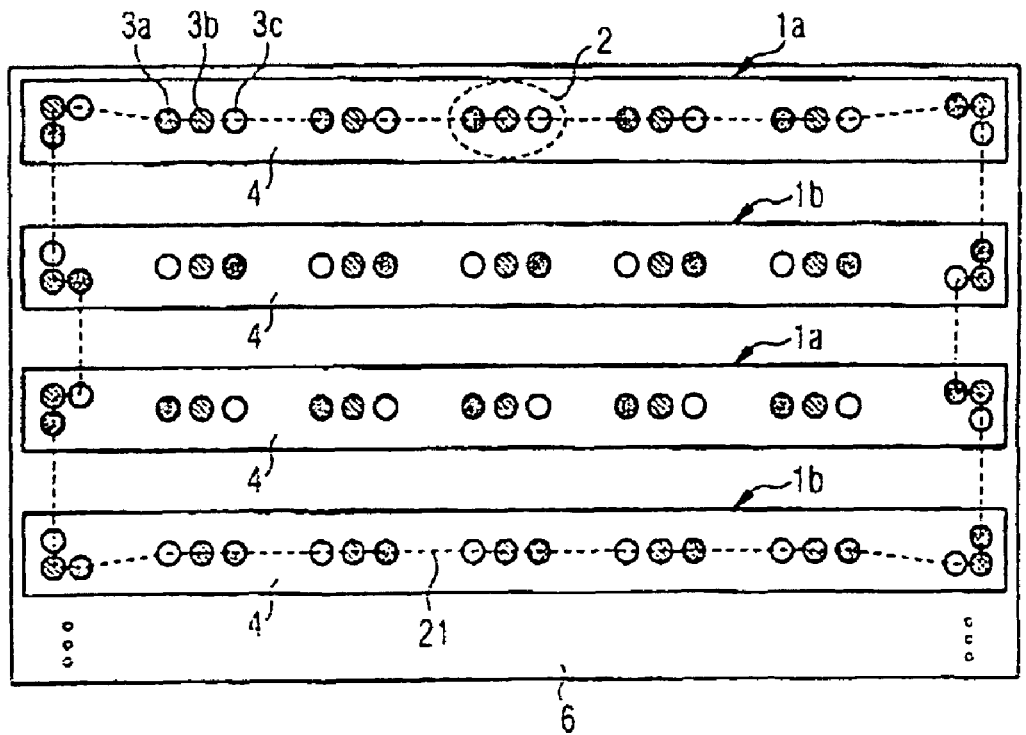

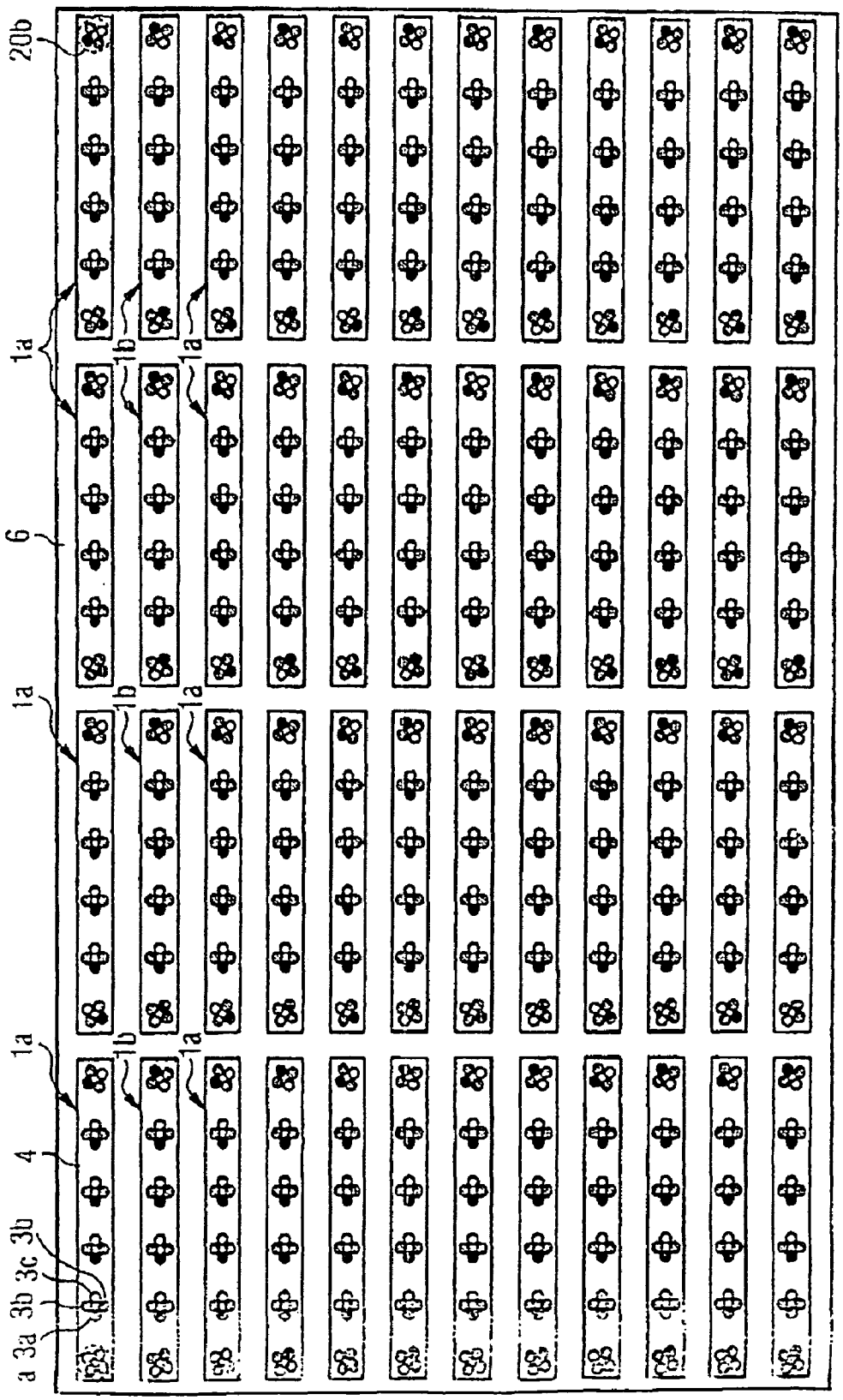

ILLUMINATION DEVICE

CROSS-REFERENCE TO RELATED APPLICATIONS

This application is the National Stage of International Application No. PCT/DE2006/002266, filed on Dec. 15, 2006, which claims the priority to German Patent Applications Serial No. 10 2005 060382.3, filed on Dec. 16, 2005 and Serial No. 10 2006 033893.6, filed on Jul. 21, 2006. The contents of these applications are hereby incorporated by reference in their entireties.

FIELD OF THE INVENTION

A lighting apparatus is specified. A display device comprising such a lighting apparatus is also specified.

BACKGROUND

Document WO2004/031844A1 describes a lighting apparatus.

SUMMARY

According to at least one embodiment of the lighting apparatus, the lighting apparatus includes at least one light module. The light module includes a circuit board and a plurality of groups of light sources mounted on the circuit board. The circuit board forms a connection carrier for the light sources. The circuit board can, for example, include a base body which is configured to be electrically insulating and on which are formed conductive traces made from an electrically conductive material. The light sources of the light module are electrically contacted via the conductive traces of the circuit board.

Each group of light sources of the light module includes at least one light source, preferably at least two light sources, particularly preferably at least three light sources.

The light module preferably includes at least two groups of light sources that are similarly configured. These groups then include the same number of similar light sources. The light sources of the similarly configured groups are arranged in the same respective manner relative to one another. That is, the light sources of two similarly configured groups are, for example, arranged in the same pattern.

According to at least one embodiment of the lighting apparatus, the at least one light module of the lighting apparatus is mechanically attached to a carrier of the lighting apparatus. Preferably, a multiplicity of similarly configured light modules is attached to the carrier.

According to at least one embodiment, the light modules of the lighting apparatus are arranged in rows on the carrier of the lighting apparatus. "Arranged in rows" means that each light module forms at least one row of the lighting apparatus. In the row of the lighting apparatus, groups of light sources of the associated light module are arranged next to one another in the horizontal direction. In the vertical direction, the light module is then followed by another light module that forms another row of the lighting apparatus.

According to at least one embodiment of the lighting apparatus, the lighting apparatus includes a plurality of light modules, each of which includes a plurality of groups of light sources mounted on a circuit board of the respective light module, and the light modules are arranged in rows on a carrier of the lighting apparatus.

According to at least one embodiment, at least one of the light modules of the lighting apparatus is configured in strip form. Preferably all the light modules of the lighting apparatus are then configured in strip form.

"In strip form" means, among other things, that the length of the light module is greater than the width of the light module. "In strip form" can further mean that a multiplicity of groups of light sources are arranged on the circuit board of the light module next to one another in a main direction of extension of the light module.

According to at least one embodiment, the lighting apparatus includes at least one first light module and at least one second light module. The first and the second light modules are configured differently. For example, at least one group of light sources of the first light module is different from a corresponding group of light sources of the second light module.

"Corresponding groups of light sources" is to be understood here as meaning groups that are disposed in the same place in the light module. For example, the first and second light modules differ by having different groups of light sources at the right and left outermost edges of the modules. These groups of light sources differ from each other, for example, by the different arrangement of the light sources of the groups relative to one another.

According to at least one embodiment of the lighting apparatus, the second light module is obtained from the first light module by rotation. The second module is preferably produced from the first light module by a 180-degree rotation about an axis that is perpendicular to the main plane of extension of the first light module. That is, the first and the second light modules differ only by the orientation in which they are mounted on the carrier of the lighting apparatus.

According to at least one embodiment of the lighting apparatus, the groups of light sources of the lighting apparatus are arranged at the grid points of a regular grid. For example, the groups of light sources are centered on the grid points of the regular grid. To this end, for example, the geometric centroid of a group of light sources can coincide with a grid point of the regular grid. This is then preferably true of all the groups of light sources in the lighting apparatus.

The regular grid has one of the following grid structures, for example: hexagonal, rhombic, rectangular, square, lozenge-shaped.

According to at least one embodiment, each group of light sources includes at least one light-emitting diode (LED). Each group of light sources preferably includes at least two LEDs that are suitable for emitting light of mutually different colors. That is, the group includes, for example, a first LED suitable for emitting blue light, a second LED suitable for emitting red light and a third LED suitable for emitting green light. Particularly preferably, each of the groups is suitable for radiating white mixed light. That is, the light from the LEDs in each of the groups of light sources intermixes to yield white light.

According to at least one embodiment, at least one light source of the light module includes an LED. Preferably all of the light sources of the lighting apparatus are each formed by an LED. The LED preferably includes a carrier and/or a housing, at least one LED chip, and an optical element that is disposed downstream of the LED chip in its radiation direction. "Disposed downstream of" means here that a large portion of the electromagnetic radiation emitted by the LED chip passes through the optical element of the LED and is optically manipulated by that optical element.

According to at least one embodiment of the lighting apparatus, at least one LED of the lighting apparatus includes an LED chip provided to generate radiation and an optical element having an optical axis, it being the case that said optical element comprises a radiation exit surface and said radiation exit surface has a concavely curved subregion and a convexly curved subregion that at least partially surrounds said concavely curved subregion at a distance from the optical axis, said optical axis passing through the concavely curved subregion.

Such a conformation of the radiation exit surface of the optical element facilitates varying the radiation characteristic of the LED, such that the radiant power coupled out of the LED at an angle to the optical axis of more than zero is increased in comparison to the radiation characteristic of the LED without an optical element. This effect is due in particular to the convexly curved subregion, which increases the fraction of the radiation that is coupled out of the LED at large angles to the optical axis. The LED comprising such an optical element is therefore particularly well suited for uniformly illuminating a comparatively large, particularly planar surface, including in areas that are offset laterally from the optical axis.

According to at least one embodiment of the lighting apparatus, the optical axis of the optical element passes through the LED chip of the LED. The LED chip can in particular be arranged so that it is centered with respect to the optical axis. This means, for example, that the optical axis passes through the geometric center of a radiation exit surface of the LED chip. The optical axis of the optical element is then preferably perpendicular to the radiation exit surface of the LED chip. Such an arrangement of the LED chip relative to the optical element facilitates uniform beam shaping, by the optical element, of the electromagnetic radiation generated by the LED chip. The optical element is preferably implemented as rotationally symmetrical with respect to the optical axis. The lighting apparatus can thus be made to have a radiation characteristic that is homogeneous and uniform azimuthally to the optical axis.

According to at least one embodiment of the lighting apparatus, the LED chip of at least one light source is configured as a thin-film LED chip. Preferably all the LED chips of the lighting apparatus are implemented as thin-film LED chips. That is, the LED chips include an epitaxially grown layer sequence in which a growth substrate has either been thinned or completely removed. The epitaxially grown layers of the layer sequence are then mounted, by their surface facing away from the original growth substrate, on a carrier or directly on the circuit board of the light module. Optoelectronic semiconductor chips of thin-film construction are described, for example, in the documents WO 02/13281 or EP 0905797, whose disclosure content with regard to the thin-film construction of optoelectronic semiconductor chips is hereby expressly incorporated by reference.

The groups of light sources of the lighting apparatus are preferably arranged such that the lighting apparatus is suitable for shedding uniform white light on a surface that is spaced apart from the lighting apparatus in the radiation direction of the light sources. According to at least one embodiment of the lighting apparatus, the light sources of the lighting apparatus are so arranged at the edge of the lighting apparatus that a periodic sequence of different-colored light sources is observed if one scans along the light sources disposed near the edge. I.e., for example, the following LEDs occur in sequence in scanning along the light sources disposed near the edge: red LED, green LED, blue LED, red LED, green LED, blue LED, red LED, and so on.

The edge of the area to be illuminated is thereby illuminated uniformly with each color, such that a uniform mixture of light—preferably uniform white mixed light—is obtained at the edge.

A display device is also specified. According to at least one embodiment, the display device includes an imaging unit. The imaging unit is implemented, for example, as an LCD panel (LCD=Liquid Crystal Display). The imaging unit comprises a surface that is backlit by a lighting apparatus as described in at least one of the embodiments. Said imaging unit is preferably backlit directly by the lighting apparatus. That is, the imaging unit is disposed downstream of the lighting apparatus in a radiation direction of the light sources of the lighting apparatus. "Disposed downstream of" means here that at least a large portion of the electromagnetic radiation emitted by the light sources strikes the imaging unit. The imaging unit is preferably arranged parallel to the carrier of the lighting apparatus.

The lighting apparatus described herein will be explained in more detail below with reference to exemplary embodiments and the associated figures.

BRIEF DESCRIPTION OF THE DRAWINGS

FIG. 1 is a schematic plan view of a first exemplary embodiment of a here-described lighting apparatus.

FIG. 2 is a schematic plan view of a second exemplary embodiment of a here-described lighting apparatus.

FIG. 8 is a schematic plan view of a sixth exemplary embodiment of a here-described lighting apparatus.

Figure 3:
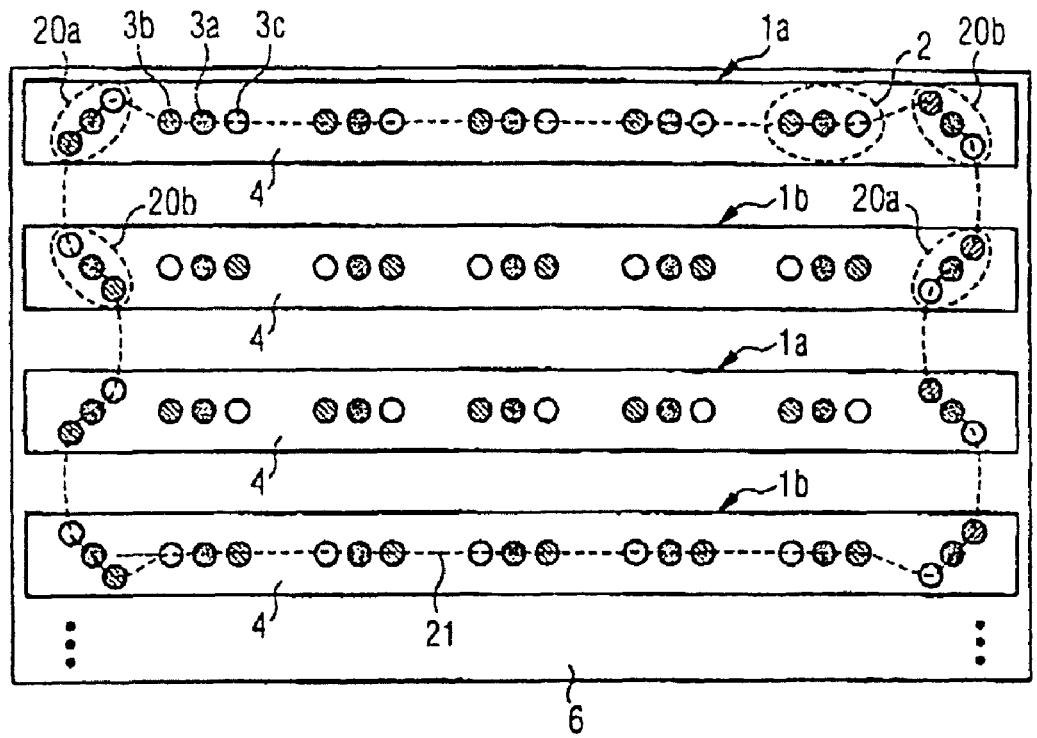
FIG. 3 is a schematic plan view of a third exemplary embodiment of a here-described lighting apparatus.

In the exemplary embodiment and figures, like or like-acting elements are provided with the same respective reference numerals. The illustrated elements are basically not to be considered true to scale, but rather, individual elements may be depicted as exaggeratedly large for the sake of better understanding.

DETAILED DESCRIPTION

FIG. 1 is a schematic plan view of a first exemplary embodiment of a here-described lighting apparatus.

The lighting apparatus includes a plurality of light modules 1a, 1b. Each light module 1a, 1b includes a plurality of groups 2a, 2b, 20a, 20b of light sources. In the exemplary embodiment described in conjunction with FIG. 1, the light sources are formed in each case by one blue LED 3a, one red LED 3c and one green LED 3b per group.

The light modules 1a, 1b are configured in strip form. The groups of light sources of a particular light module 1a and 1b are aligned along a straight line that extends in a horizontal direction. The light modules 1a, 1b of the lighting apparatus are arranged in rows on a carrier 6 of the lighting apparatus and are there mechanically attached.

The lighting apparatus includes first light modules 1a and second light modules 1b. The first light modules 1a differ from the second light modules 1b by the groups 20a, 20b of light sources at the left and right edges of the lighting apparatus. Light module 1b is obtained from light module 1a by a 180-degree rotation about axis A, which is perpendicular to a circuit board 4 of the light module. That is, light modules 1a, 1b differ from each other merely by their orientation on the carrier 6. In this way, the lighting apparatus can be made from otherwise identical light modules. This permits especially low-cost mass production of the light modules. The alternating arrangement of first light modules 1a and second light modules 1b results in a lighting apparatus in which alternating red, green and blue LEDs are disposed at the edge. The light from the red, green and blue LEDs intermixes to yield white light. By virtue of the alternating arrangement at the edge—see also dashed line 21—uniform white mixed light is produced even in the edge region.

The LEDs 3a, 3b, 3c of light modules 1a, 1b are mounted on circuit boards 4. Said circuit boards 4 are, for example, printed circuit boards, flexible printed circuit boards or metal-core boards.

FIG. 2 is a schematic plan view of a second exemplary embodiment of a here-described lighting apparatus. In the exemplary embodiment described in conjunction with FIG. 2, some of the LEDs 3a, 3b, 3c are disposed in groups 2 in which the LEDs 3a, 3b, 3c are arranged linearly, i.e., in a straight line. Arranging the LEDs 3a, 3b, 3c in rows is possible particularly with one- to three-colored groups 2 of light sources, since otherwise the color mixing will be adversely affected.

FIG. 3 is a plan view of a third exemplary embodiment of a here-described lighting apparatus. In contrast to the exemplary embodiment described in conjunction with FIG. 2, in this exemplary embodiment the LEDs 3a, 3b, 3c of the groups 20a, 20b in the edge region of the lighting apparatus are also linearly arranged, but are rotated relative to the groups 2 in the center of the lighting apparatus by a given angle, for example ±45°.

Figure 4:
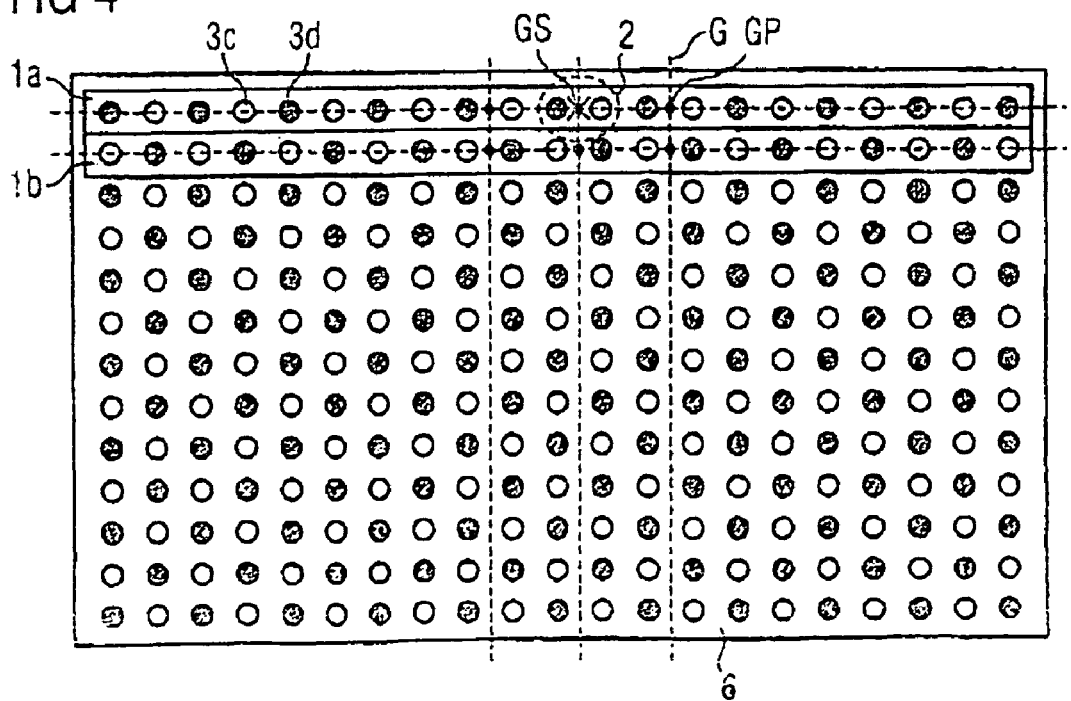
FIG. 4 is a schematic plan view of a fourth exemplary embodiment of a here-described lighting apparatus.

FIG. 4 is a plan view of a fourth exemplary embodiment of a here-described lighting apparatus.

The light modules 1a, 1b of the lighting apparatus according to the fourth exemplary embodiment include red LEDs 3c and blue-green LEDs 3d. In the case of the blue-green LEDs 3d, the emitted light is partially converted by means of a luminescence conversion material. LEDs 3d include, for example, an LED chip 300 suitable for generating light in the UV and/or blue region of the spectrum. A luminescence conversion material is disposed downstream of the LED chip, such that a portion of the emitted electromagnetic radiation is converted into electromagnetic radiation in the green region of the spectrum. LED 3d is thereby suitable for emitting blue-green mixed light. Each red LED 3c and blue-green LED 3d form a group 2 of light sources. The groups 2 are arranged at the grid points GP of a rectangular grid G. The geometric centroid GS of said group 2—marked with an X in FIG. 4—is disposed on a grid point GP of the grid G.

Figure 5:
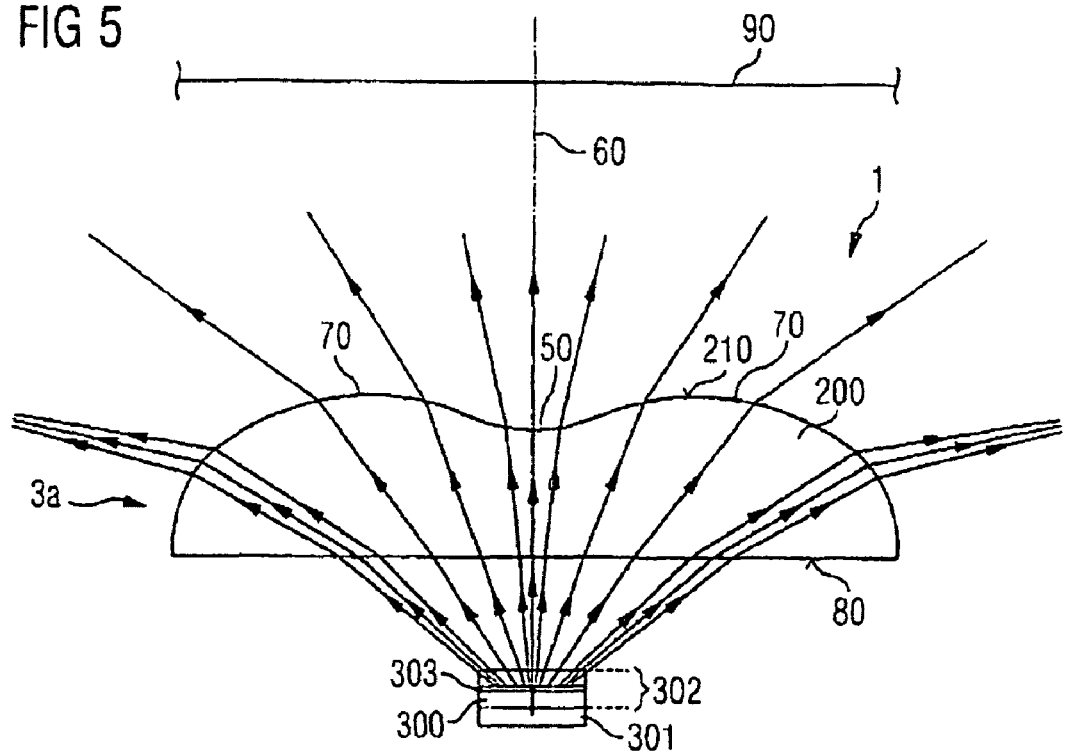
FIG. 5 is a schematic sectional representation of an LED 3a as used in a light module 1 of the lighting apparatus.

FIG. 5 is a schematic sectional representation of an LED 3a as used in a light module 1 of the lighting apparatus. LED 3a includes an LED chip 300. LED 3a further includes an optical element 200.

A radiation exit surface 210 of the optical element 200 has a concavely curved subregion 50. The optical axis 60 of optical element 200 passes through said concavely curved subregion 50. Optical element 200 also has a convexly curved subregion 70, which surrounds concavely curved subregion 50 at a distance from the optical axis 60. The convexly curved subregion 70 can be implemented in the manner of a convex lens. The concavely curved subregion 50 can be implemented in manner of a concave lens.

Electromagnetic radiation generated in an active region 303 of the LED chip 300 enters the optical element 200 through a preferably planar radiation entrance surface 80. The radiation—particularly visible radiation, i.e. light—generated by the LED chip 300 is illustrated in FIG. 5 in the form of lines marked with arrows and symbolizing individual light beams.

The optical element 200 is configured to uniformly illuminate a surface 90, for instance a diffuser film or the imaging unit of a display device, such as for example an LCD panel. The optical axis 60 of optical element 200 preferably passes through surface 90. Surface 90 in this case preferably extends perpendicularly or substantially perpendicularly to the optical axis 60.

The optical axis 60 passes through the LED chip 300. The LED chip 300 is preferably centered on the optical axis 60. The optical axis 60 in that case is perpendicular to the active region 303 of the LED chip 300. Said LED chip 300 is preferably a thin-film LED chip as described previously herein, comprising a carrier 301 and a preferably epitaxially produced semiconductor body 302 that includes the active region 303. The growth substrate for the semiconductor body 302 is removed in that case. The carrier 301 is therefore different from the growth substrate and need not satisfy the high requirements placed on a growth substrate, but can be relatively freely selected with a view toward other properties that will be advantageous to the LED chip 300, such as high thermal conductivity, for example.

Figure 6:
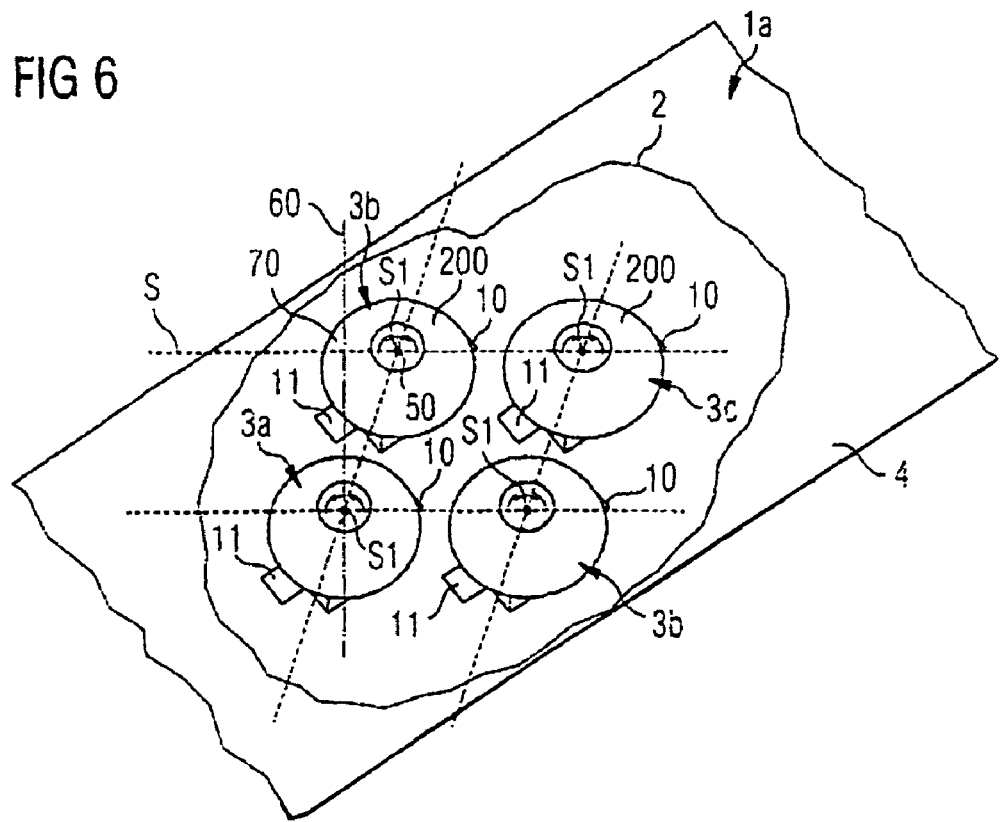
FIG. 6 is a schematic perspective representation of a detail of a light module 1 as can be used in one of the previously above-described exemplary embodiments of the lighting apparatus.

FIG. 6 is a schematic perspective representation of a detail of a light module 1 as can be used in one of the previously above-described exemplary embodiments of the lighting apparatus. A group 2 of LEDs 3a, 3b and 3c is depicted more closely by way of example in FIG. 6. The group 2 includes two green LEDs 3b, one red LED 3c and one blue LED 3a. The LEDs 3a, 3b, 3c include an optical element 200 as described in conjunction with FIG. 5. Said optical element 200 has a concavely curved subregion 50 which is completely surrounded by a convexly curved subregion 70. The optical element 200 is configured here as rotationally symmetrical with respect to the optical axis 60. Optical element 200 is suitable for shaping the radiation characteristic of the LED in such a way that the LED particularly uniformly illuminates a surface 90 that is spatially separated from it. The action of the optical element 200 further promotes the generation of particularly uniform white mixed light.

LEDs 3a, 3b, 3c are each electrically contacted to the circuit board 4 by means of two contact sites 10, 11.

The LEDs 3a, 3b, 3c of group 2 are arranged on the grid points S1 of a regular grid S. The grid points S1 preferably coincide with the piercing points of the optical axis 60 through the radiation exit surface 210 of the optical element 200 of each LED. Due to the rotational symmetry of the LEDs 3a, 3b, 3c, the grid points S further coincide with the geometric centroids of the optical elements 200. The spacing between individual LEDs 3a, 3b, 3c of a group 2 is preferably between 10 and 20 mm. The spacing between two adjacent groups 2 of LEDs 3a, 3b, 3c is preferably between 30 and 100 mm.

Figure 7:
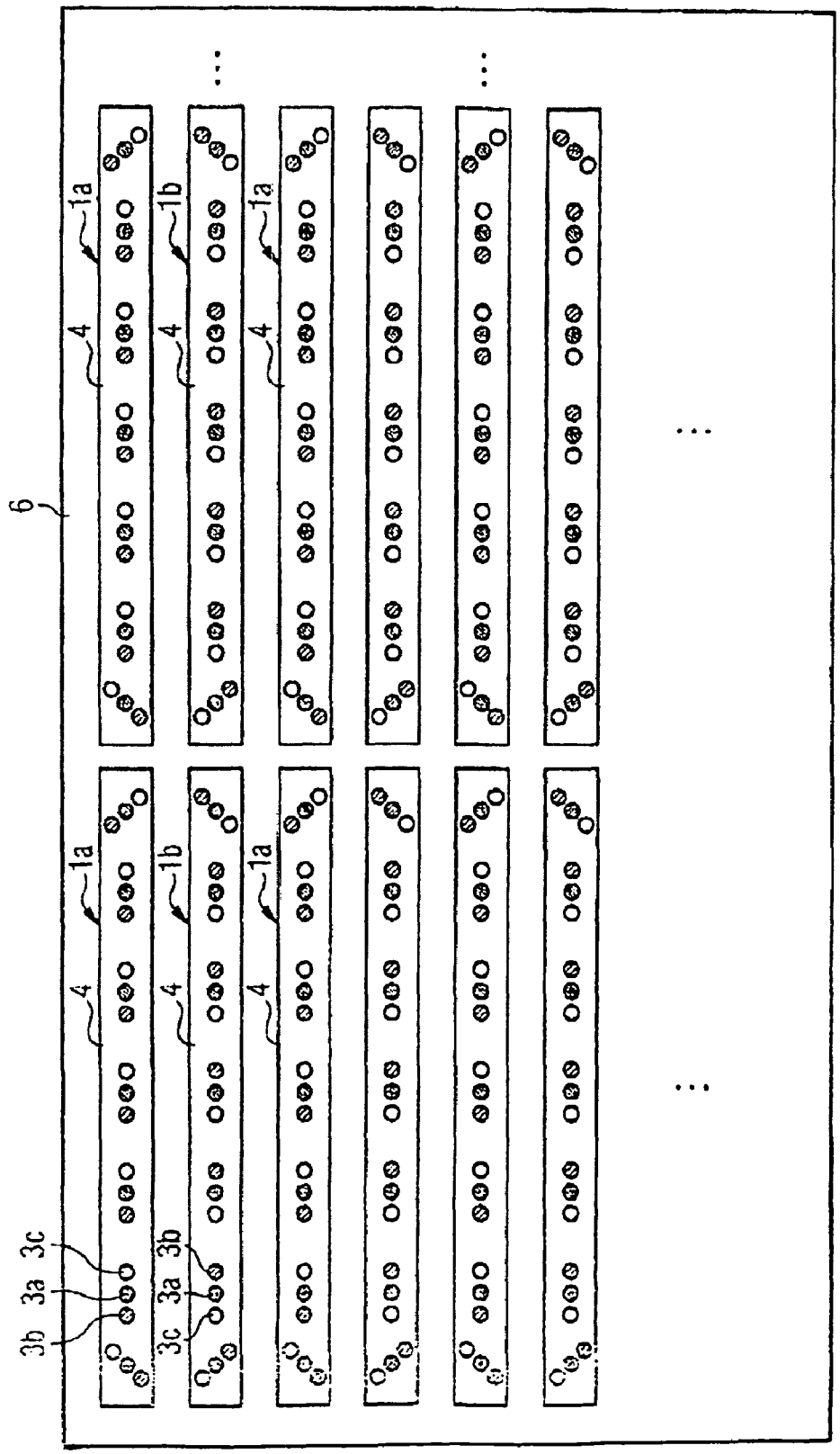
FIG. 7 is a schematic plan view of a fifth exemplary embodiment of a here-described lighting apparatus.

FIG. 7 is a schematic plan view of a fifth exemplary embodiment of a here-described lighting apparatus. In contrast to the exemplary embodiment described in conjunction with FIG. 3, in this exemplary embodiment the light modules 1a, 1b are arranged next to one another also in the lateral direction. Further, as in the exemplary embodiment described in conjunction with FIG. 3, the light modules 1a, 1b are arranged in rows on the carrier 6 and are there mechanically attached.

FIG. 8 is a schematic plan view of a sixth exemplary embodiment of a here-described lighting apparatus. In contrast to the lighting apparatus described in conjunction with FIG. 7, the LEDs 3a, 3b, 3c in this exemplary embodiment are each arranged in a cross-like manner. The groups of LEDs 3a, 3b and 3c thus are arranged as illustrated, for example, in the schematic perspective representation of FIG. 6. Each group 2 of LEDs here includes two green LEDs 3b, one red LED 3c and one blue LED 3a.

The groups of LEDs 20a, 20b in the respective edge regions of the light modules 1a, 1b are rotated by a given angle relative to the groups 2 in the respective centers of the light modules 1a, 1b. For example, they are rotated by ±45°. It is also possible in this case (not illustrated in FIG. 8) for light module 1b to be obtained from light module 1a by a 180-degree rotation about an axis that is perpendicular to a circuit board 4 of the light module.

The invention is not limited by the description made with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. A lighting apparatus comprising
   a plurality of light modules with at least one first light module and at least one second light module, said first light module being different from said second light module, wherein
   each light module includes a plurality of three-colored groups of light sources mounted on a circuit board of said light module, and said light modules are arranged in rows on a carrier of said lighting apparatus,
   wherein said first and said second light modules are arranged alternatingly in rows on said carrier,
   wherein said second light module is obtained from said first light module by rotation about an axis that is perpendicular to the said circuit board of said first light module
   wherein the light sources of each group are linearly arranged, and
   wherein groups in an edge region of the lighting apparatus are rotated relative to the groups in the center of the lighting apparatus by a given angle.

2. The lighting apparatus according to claim 1, wherein at least one of said light sources includes an light-emitting diode.

3. The lighting apparatus according to claim 2,
   wherein said light-emitting diode includes an light-emitting diode chip provided to generate radiation and an optical element having an optical axis, wherein
   said optical element comprises a radiation exit surface and
   said radiation exit surface has a concavely curved subregion and a convexly curved subregion that at least partially surrounds said concavely curved subregion at a distance from said optical axis, said optical axis passing through said concavely curved subregion.

4. The lighting apparatus according to claim 3, wherein said light emitting diode chip is constituted by a thin-film light-emitting diode chip.

5. The lighting apparatus according to claim 1, wherein said groups of said light sources are arranged at grid points of a regular grid.

6. The lighting apparatus according to claim 5, wherein each said group of said light sources is centered on a said grid point of said regular grid.

7. The lighting apparatus according to claim 1, wherein each said group of said light sources includes at least two light-emitting diodes which emit light of mutually different colors.

8. The lighting apparatus according to claim 1, wherein each group of light sources emits white mixed light.

9. A display device with a lighting apparatus comprising:
   an imaging unit and
   a backlighting device for said imaging unit and constituted by a lighting apparatus according to claim 1.

10. The display device according to claim 9,
    wherein said imaging unit includes an liquid crystal display panel and said liquid crystal display panel is arranged parallel to the said circuit board of at least one of said light modules.

11. The lighting apparatus according to claim 1, wherein positions of said second light module and said first light module provides a periodic sequence of red, green and blue light sources at the edge of the lighting apparatus.

12. The lighting apparatus according to claim 1, wherein the groups in the edge region of the lighting apparatus are rotated relative to the groups in the center of the lighting apparatus by +/−45°.

13. The lighting apparatus according to claim 1, wherein each group comprises three light-emitting diodes.

14. The lighting apparatus according to claim 1, wherein spacing between two adjacent groups exceeds spacing between two adjacent LEDs within a group.

15. The lighting apparatus according to claim 1, wherein spacing between individual LEDs of a group is between 10 mm and 20 mm and spacing between two adjacent groups of LEDs is between 30 mm and 100 mm.

* * * * *